(12) United States Patent
Uda et al.

(10) Patent No.: US 6,653,232 B2
(45) Date of Patent: Nov. 25, 2003

(54) METHOD OF MANUFACTURING MEMBER PATTERN AND METHOD OF MANUFACTURING WIRING, CIRCUIT SUBSTRATE, ELECTRON SOURCE, AND IMAGE-FORMING APPARATUS

(75) Inventors: Yoshimi Uda, Kanagawa (JP); Kazuya Ishiwata, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/207,864

(22) Filed: Jul. 31, 2002

(65) Prior Publication Data

US 2003/0027417 A1 Feb. 6, 2003

(30) Foreign Application Priority Data

Aug. 3, 2001 (JP) ........................................ 2001-235670

(51) Int. Cl.[7] .............................................. H01L 21/44
(52) U.S. Cl. ........................... 438/669; 438/20; 438/34; 438/623; 438/780; 148/DIG. 137
(58) Field of Search ............................. 438/20, 28, 34, 438/618, 622, 623, 669, 780, 781; 148/DIG. 137

(56) References Cited

U.S. PATENT DOCUMENTS 5,839,363 A  11/1998  Yanagisawa et al. ....... 101/123
6,030,707 A * 2/2000  Katoh et al. .................. 428/427
6,213,834 B1 * 4/2001  Ohnishi et al. ................. 445/6
6,399,282 B1 * 6/2002  Kubota et al. ............... 430/311
6,426,588 B1 * 7/2002  Yanagisawa ................. 313/422
2002/0095785 A1 * 7/2002  Kubo et al. .................... 29/846

FOREIGN PATENT DOCUMENTS

JP          8-34110        2/1996
JP      P2000-251682 A     9/2000

* cited by examiner

*Primary Examiner*—Trung Dang
(74) *Attorney, Agent, or Firm*—Fitzpatrick, Cella, Harper & Scinto

(57) ABSTRACT

A method of manufacturing wiring includes a step of forming a conductive layer pattern through a developing step after performing film formation and exposure step using photosensitive paste that contains a photosensitive material and a conductive material, a step of forming an insulating layer pattern through a developing step after performing film formation and exposure step using photosensitive paste that contains a photosensitive material and an insulating material, and a baking step for baking the conductive layer pattern and the insulating layer pattern. Thus, a wiring pattern can be formed with high precision by reducing an edge curl.

12 Claims, 11 Drawing Sheets

FORMING FILM → EXPOSURE → DEVELOPING → FORMING FILM → EXPOSURE → DEVELOPING → BAKING

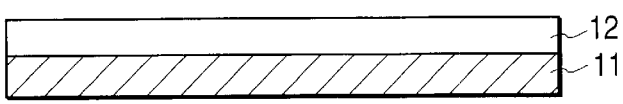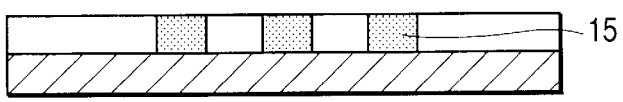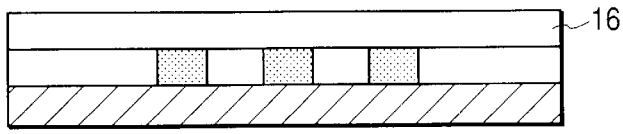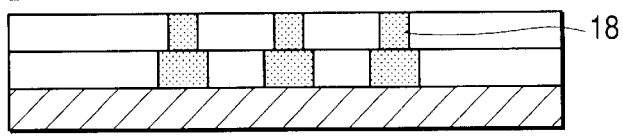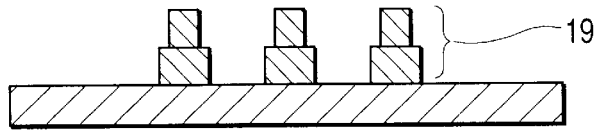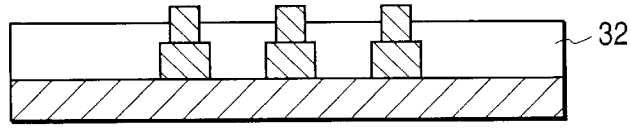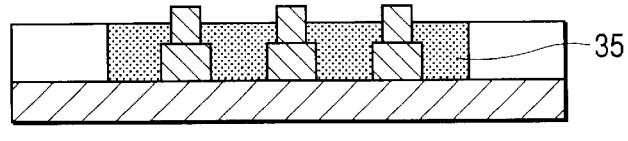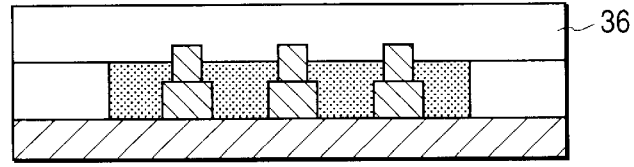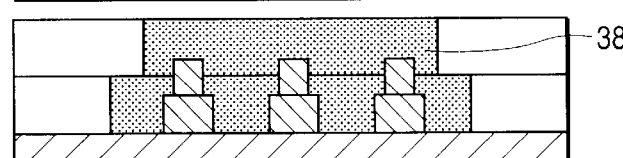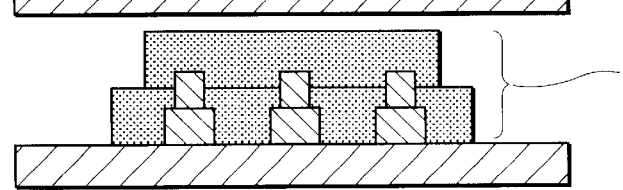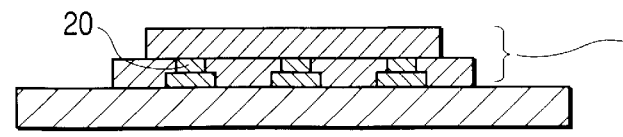

X-DIRECTION

Y-DIRECTION

X-DIRECTION

Y-DIRECTION

METHOD OF MANUFACTURING MEMBER PATTERN AND METHOD OF MANUFACTURING WIRING, CIRCUIT SUBSTRATE, ELECTRON SOURCE, AND IMAGE-FORMING APPARATUS

BACKGROUND OF THE INVENTION

1. Field of the Invention

The present invention relates to a method of manufacturing a member pattern, wiring, circuit substrate, electron source, and image-forming apparatus using photosensitive paste.

2. Related Background Art

Two kinds of electron-emitting devices, hot electron sources and cold cathode electron sources, have been known as electron-emitting devices applied as electron sources of image-forming apparatus and the like. Examples of the cold cathode electron source include a field emission device (FE device), a metal-insulating layer-metal device (MIM device), and a surface conduction electron-emitting device.

The structure of the surface conduction electron-emitting device is shown in FIGS. 12A and 12B. FIG. 12A is a schematic plan view of the surface conduction electron-emitting device and FIG. 12B is a schematic sectional view taken along the line 12B—12B in FIG. 12A. In FIGS. 12A and 12B, 11 denotes an insulating substrate, 7, an electron-emitting conductive film, 2 and 3, electrodes, and 8, an electron-emitting region.

FIG. 13 is a rough structural diagram showing an example of image-forming apparatus that uses an electron-emitting device such as the surface conduction electron-emitting device shown in FIGS. 12A and 12B. In FIG. 13, 81 denotes a substrate, 82, an outer frame, and 86, a face plate where an image-forming member 84 is arranged. An envelope (airtight container) 88 is provided for seal-bonding of joints of the outer frame 82, substrate 81, and face plate 86 with an adhesive such as low melting point glass frit, which is not shown in the drawing. The interior of the image-forming apparatus is thus kept vacuum by the envelope 88.

A substrate 11 is fixed to the substrate 81. On the substrate 11, n×m electron-emitting devices denoted by 74 are arranged (n and m are each a positive integer equal to or larger than 2, and are set appropriately in accordance with the objective display pixel number).

The electron-emitting devices 74 are connected to wiring 4 and 6. The wiring in FIG. 13 is composed of m lines of row-directional wiring 4 and n lines of column-directional wiring 6 (also called matrix wiring). The row-directional wiring 4 and the column-directional wiring 6 are insulated from each other by placing not-shown insulating layers at intersections between the row-directional wiring 4 and the column-directional wiring 6.

In order to manufacture the above image-forming apparatus, a large number of row-directional wiring 4 and column-directional wiring 6 are required.

A method of forming a large number of row-directional wiring 4 and column-directional wiring 6 is disclosed in Japanese Patent Application Laid-Open No. 08-34110 in which the wiring are formed using a printing technique that can handle a large area at a relatively low cost without needing vacuum apparatus or the like.

To enhance the definition of image-forming apparatus as the one described above, wiring for feeding current to electron-emitting devices to drive the electron-emitting devices has to be formed even more precisely.

A method using photosensitive paste can be considered as a way to form the above wiring with high precision. Japanese Patent Application Laid-Open No. 2000-251682 discloses formation of wiring using photosensitive paste.

SUMMARY OF THE INVENTION

An object of the present invention is to provide a method of manufacturing a member pattern such as wiring which can reduce an edge curl, and a method of manufacturing a wiring, a circuit substrate, an electron source and an image forming apparatus incorporating the above method of manufacturing the member pattern. In order to achieve the above-mentioned object, a method of manufacturing wiring according to the present invention includes: a step of forming a conductive layer pattern through a developing step after performing film formation and exposure step once or several times using photosensitive paste that contains a photosensitive material and a conductive material; a step of forming an insulating layer pattern on at least a part of the conductive pattern through a developing step after performing film formation and exposure step once or several times using photosensitive paste that contains a photosensitive material and an insulating material; and a baking step for baking the conductive layer pattern and the insulating layer pattern. Further, according to another aspect of the present invention, there is provided a method of manufacturing a member pattern with a first member patterned on a substrate and a second member patterned over the first member to the substrate, the method including: a step of applying first photosensitive paste to the top face of the substrate; a step of forming a precursor pattern of the first member by exposing and developing the first photosensitive paste; a step of applying second photosensitive paste over the top face of the precursor pattern of the first member to the top face of the substrate; a step of forming a precursor pattern of the second member by exposing and developing the second photosensitive paste; and a step of baking the precursor patterns of the first and second members.

BRIEF DESCRIPTION OF THE DRAWINGS

In the accompanying drawings:

FIGS. 3A, 3B, 3C, 3D, 3E, 3F, 3G, 3H, 3I, 3J and 3K are process diagrams showing a method of manufacturing wiring in accordance with Embodiment 3 of the present invention;

DESCRIPTION OF THE PREFERRED EMBODIMENTS

Figure 1A:
FIGS. 1A, 1B, 1C, 1D, 1E, 1F and 1G are process diagrams showing a method of manufacturing wiring in accordance with Embodiment 1 of the present invention.

The present invention relates to a method of manufacturing a member pattern with a first member patterned on a substrate and a second member patterned over the first member to the substrate, characterized by comprising: a step of applying first photosensitive paste to the top face of the substrate; a step of forming a precursor pattern of the first member by exposing and developing the first photosensitive paste; a step of applying second photosensitive paste over the top face of the precursor pattern of the first member to the top face of the substrate; a step of forming a precursor pattern of the second member by exposing and developing the second photosensitive paste; and a step of baking the precursor patterns of the first and second members.

A member pattern of the present invention refers to a pattern of an insulating layer or a pattern of a conductive layer. More specifically, it means a wiring pattern composed of a conductive layer or wiring pattern composed of a plurality of conductive layers and insulating layers that are placed between the plural conductive layers.

A method of manufacturing wiring according to the present invention is characterized by comprising: a step of forming a conductive layer pattern through a developing step after performing film formation and exposure step once or several times using photosensitive paste that contains a photosensitive material and a conductive material; a step of forming an insulating layer pattern on at least a part of the conductive layer pattern through a developing step after performing film formation and exposure step once or several times using photosensitive paste that contains a photosensitive material and an insulating material; and a baking step for baking the conductive layer pattern and the insulating layer pattern.

A method of manufacturing wiring according to the present invention has other characteristics such that:

the step of forming the conductive layer pattern or the insulating layer pattern includes conducting the film formation and exposure step several times and the same exposure pattern is used in the plural exposure steps;

the step of forming the conductive layer pattern or the insulating layer pattern includes conducting the film formation and exposure step several times and the different exposure pattern is used in the plural exposure steps;

the main ingredient of the conductive material is a metal and the main ingredient of the insulating material is glass;

the conductive material is composed of conductive particles; and the wiring thickness after the baking step is set to 5 $\mu$m or more.

The present invention relates to a method of manufacturing a circuit substrate with wiring, characterized in that the wiring is manufactured by the above-mentioned manufacture method of the present invention.

The present invention relates to a method of manufacturing an electron source with wiring and electron-emitting device that is supplied with current by the wiring to be driven, characterized in that the wiring is manufactured by the above-mentioned manufacture method of the present invention.

Also, the present invention relates to a method of manufacturing image-forming apparatus with an electron source and an image-forming member that forms an image by electrons emitted from the electron source, characterized in that the electron source is manufactured by the above-mentioned manufacture method of the present invention.

For example, when image-forming apparatus of large area, several tens cm in diagonal, is to be manufactured, wiring used in the image-forming apparatus have to be lower in resistance. For that reason, it is necessary to form the wiring thick.

However, problems below arise when photosensitive paste is used simply to form thick wiring with high precision.

In general, a process of forming wiring with the use of a photosensitive paste includes forming photosensitive paste into a film, (drying), exposure, developing, and baking in this order.

If a thick film is obtained as shown in FIGS. 14A to 14D by forming photosensitive paste into a thick film at once (FIG. 14A), (drying the film), exposing the film (FIG. 14B), developing the film (FIG. 14C), and subjecting the film to baking (FIG. 14D), the following takes place. In FIGS. 14A to 14D, 11 denotes a substrate, 12, photosensitive paste, 13, a mask, 14, exposure light, 15, a latent image, 19, a developing pattern as a developed image, and 21, a wiring pattern completed.

What happens is that an edge portion of the wiring pattern 21 is curled more (hereinafter referred to as edge curl) after baking and, when an insulating layer is layered thereon in the next step, spaces to the left and right of the wiring pattern 21 under the edge curl portion are not filled with the insulating material sufficiently, leaving empty spaces.

Supposedly, this is because the volume is reduced by evaporation of a solvent or the like in the baking step (FIG. 14D) or because the exposure amount in the exposure step is insufficient due to the thick photosensitive paste film.

If the exposure amount is raised to compensate the insufficient exposure, however, it could lead to overexposure in which the sharpness of the edge portion of the wiring pattern 21 is lost or an area wider than a desired width is patterned.

Figure 13:
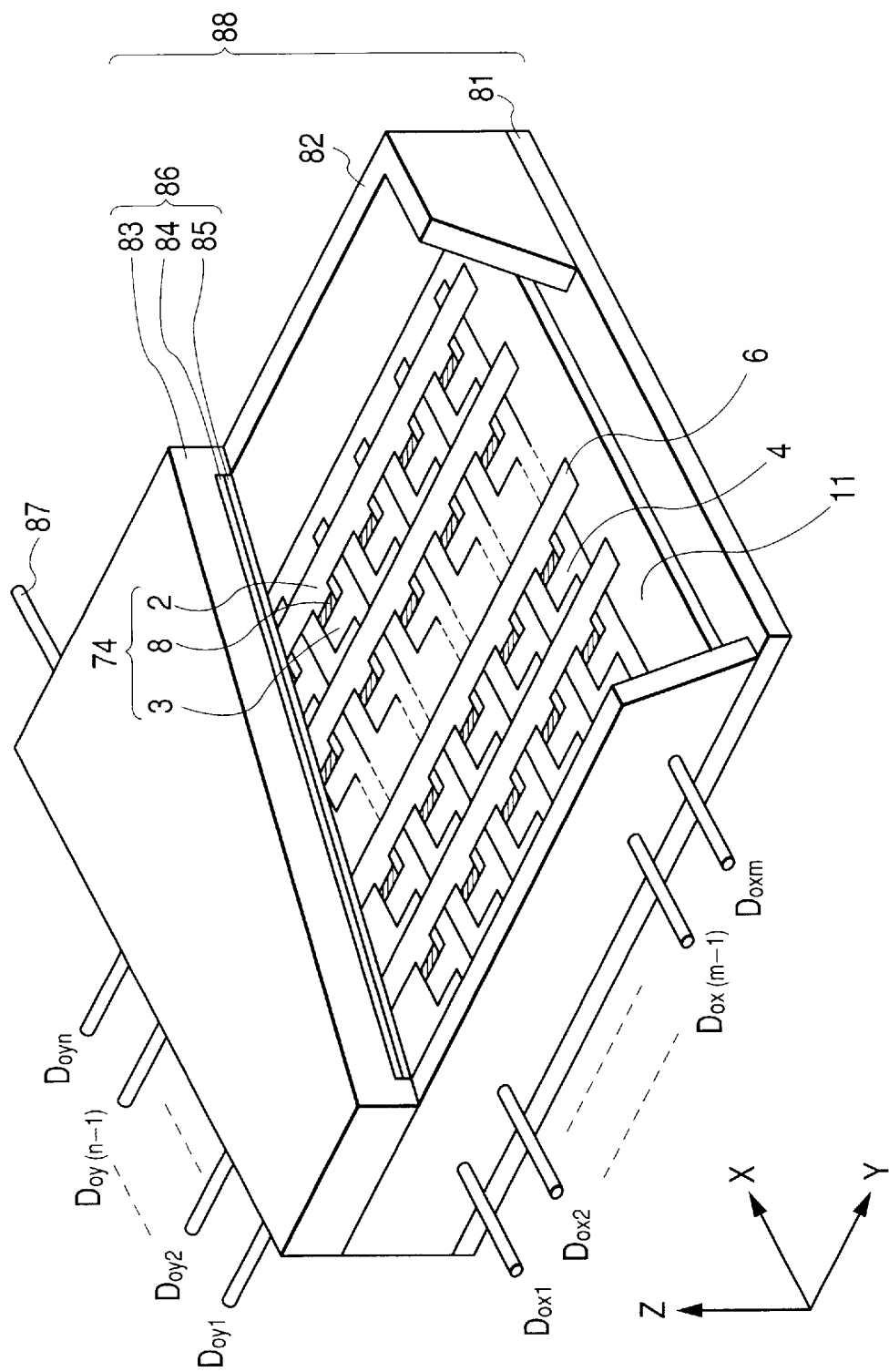
FIG. 13 is a rough structural diagram showing a conventional image-forming apparatus.

When matrix wiring (row-directional wiring and column-directional wiring) used in the image-forming apparatus of FIG. 13 is to be formed, an insulating layer has to be formed on lower layer wiring positioned on the lower side before layering upper layer wiring in order to insulate the row-directional wiring and the column-directional wiring from each other.

Therefore, if wiring having the edge curl portion described above is used as the lower layer wiring, the insulating layer is formed on the lower layer wiring with the edge curl.

When the insulating layer is formed by printing, spaces to the left and right of the lower layer wiring under the edge curl portion cause the insulating layer to contain bubbles through the baking step indispensable to printing.

The bubbles in the insulating layer impair insulation between the row-directional wiring and the column-directional wiring and, in the worst case, the row-directional wiring and the column-directional wiring short-circuit.

Furthermore, if the lower layer wiring is used as lead-out wiring of the image-forming apparatus in an airtight seal portion for electrically connecting the interior of the apparatus that needs vacuum airtightness with the external of the apparatus, the apparatus cannot be kept airtight because of the spaces to the left and right of the lower layer wiring under the edge curl portion.

The edge curl that causes the problems is observed prominently when the thickness of the photosensitive paste film after baking exceeds 5 μm. The edge curl amount is increased as the film becomes thicker.

Figure 14A:
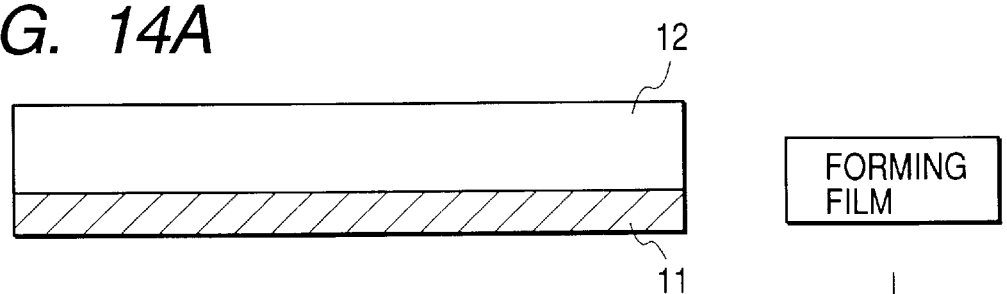
FIGS. 14A, 14B, 14C and 14D are process diagrams showing a method of manufacturing wiring in accordance with prior art.
Figure 14B:
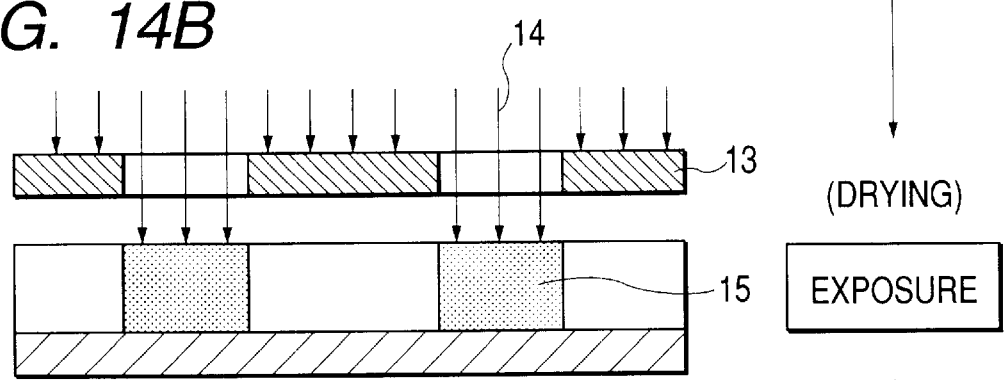
Figure 14C:
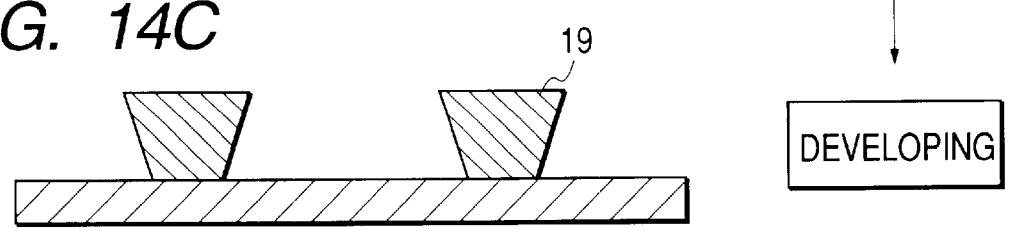
Figure 14D:
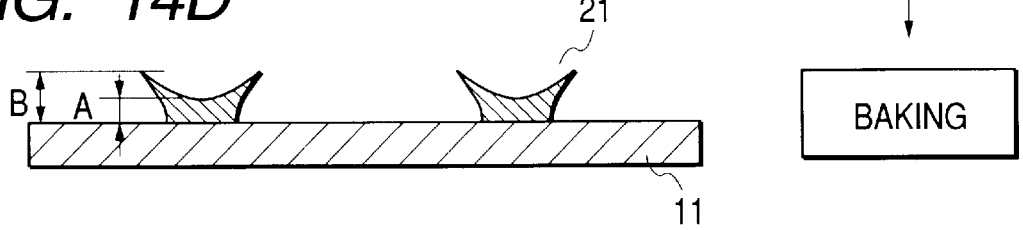

For example, when the film thickness of a portion A in FIG. 14D after baking is 10 μm, the edge curl corresponding to the thickness of a portion B in FIG. 14D is 18 to 21 μm.

The thickness of the portion A refers to the height of the wiring pattern 21 after baking from the substrate surface excluding the edge curl portion at the edge of 21. The thickness of the portion B refers to the height of the edge curl portion at the edge of the wiring pattern 21.

The edge curl amount (B/A) is about twice. The edge curl amount here means the ratio of B to A in FIG. 14D and the edge curl amount being about twice means B/A–(18/10) to (21/10)≅2.

Although depending on the thickness of the insulating layer, sometimes the edge curl amount reaches the thickness of practically one layer of the insulating layer and, in this case, the thickness corresponding to one layer of the insulating layer is substantially canceled by the edge curl.

Therefore, in order to obtain a desired level of insulation, it is necessary to form the insulating layer thick enough to compensate the edge curl. Furthermore, the thick insulating layer creates an unwanted level difference when forming the upper layer wiring on the insulating layer, thereby causing wire breakage in the upper layer wiring.

According to a method of manufacturing a member pattern of the present invention, as little space as possible is formed between a first member and a second member that is arranged over the top face of the first member and the top face of a substrate. Therefore the method can prevent the members from peeling off of the substrate.

Since formation of the space is avoided as much as possible, even if the member is in a seal portion of an airtight container, excellent sealing ability is ensured for the airtight container.

According to a method of manufacturing wiring of the present invention, a conductive layer pattern (developing pattern) and an insulating layer pattern (developing pattern) that is formed on at least a part of the conductive layer pattern are baked at once. This makes the shrinkage in the height (thickness) direction of the conductive layer dominant in the shrinkage behavior of the part of the conductive layer that is covered with the insulating layer pattern during baking, unlike the part of the conductive layer that is not covered with the insulating layer. In this way, wiring can have a conductive layer with less edge curl in the part on which the insulating layer is formed.

A circuit substrate and electron source using wiring that is formed by a manufacture method of the present invention eliminate factors that make the insulating layer contain bubbles. As a result, the level of insulation is improved, and the circuit substrate and the electron sources can have satisfying performance and be applicable to various uses.

In image-forming apparatus using wiring that is formed by a manufacture method of the present invention, since there is almost no edge curl, the insulating layer does not need an additional thickness corresponding to the height of the edge curl and no spaces are created to the left and right of the wiring, thereby making it possible to keep the airtightness in the airtight seal portion. As a result, the performance of the image-forming apparatus is improved and the image-forming apparatus can be applied to various uses.

Preferred modes of carrying out the present invention will be described in detail below using specific embodiments as examples. However, the measures, materials, shapes, relative positions, and the like of structural components in the following embodiments are not given to limit the scope of the present invention to them alone unless specifically stated.

Of the terms used below, ones that are explained in prior art have the same definitions as have been described.

Embodiment 1

Figure 1B:
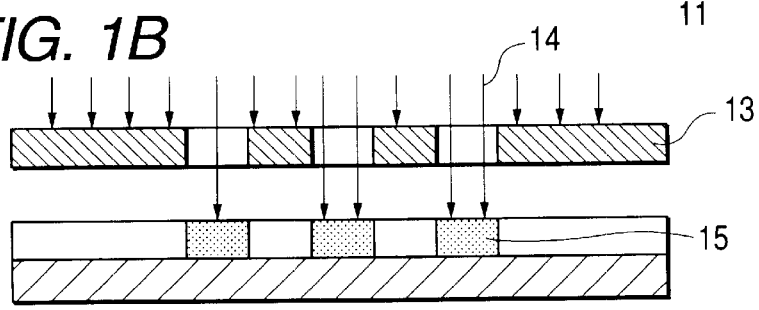
Figure 1C:
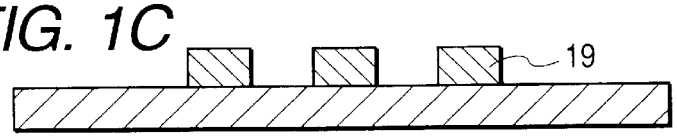
Figure 1D:
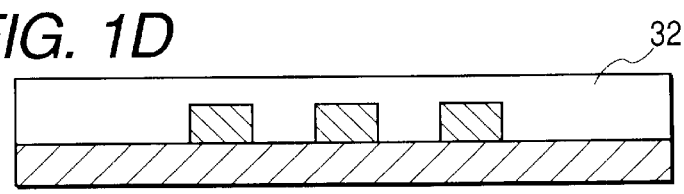
Figure 1E:
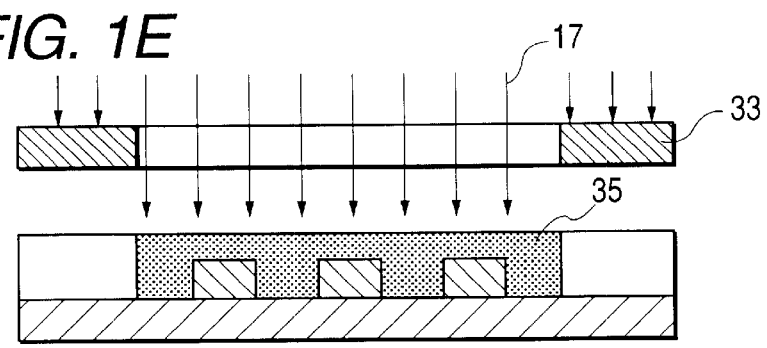
Figure 1F:
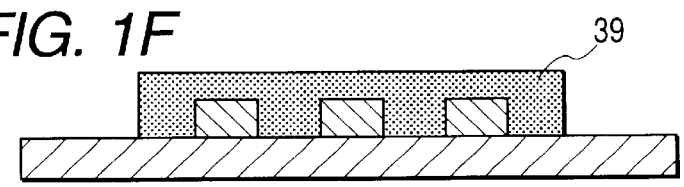
Figure 1G:
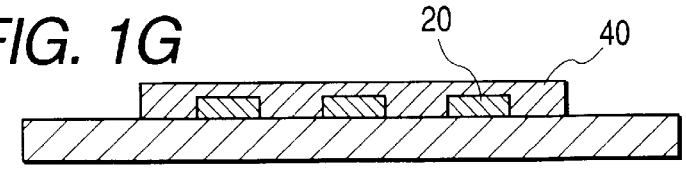

FIGS. 1A to 1G are schematic diagrams showing a process of manufacturing wiring in accordance with this embodiment. FIG. 1A is a diagram showing a state of conductive photosensitive paste after formed into a film, FIG. 1B is a diagram showing a state of the film during exposure, and FIG. 1C is a diagram showing a state of the film after developing. FIG. 1D is a diagram showing a state of insulating photosensitive paste after formed into a film, FIG. 1E is a diagram showing a state of the film during exposure, and FIG. 1F is a diagram showing a state of the film after developing. FIG. 1G is a diagram showing a state of the films after baking.

In FIGS. 1A to 1G, 11 denotes a substrate, 12 and 32 denote layers of films formed by applying photosensitive paste, and 13 and 33 denote masks for irradiating only desired regions of the layers 12 and 32 with light. Denoted by 14 and 17 are exposure light, and 15 and 35, latent images formed by exposure. 19 is a conductive layer pattern as a developed image, 39 is an insulating layer pattern as a developed image, 20 is a wiring pattern completed, and 40 is an insulating pattern completed.

A method of manufacturing wiring in this embodiment will be described below.

In FIG. 1A, the substrate 11 is formed of soda lime glass. On the substrate 11, the layer 12 is formed from photosensitive paste that contains a photosensitive material and a conductive material.

The conductive material of the photosensitive paste used is mainly silver. In addition to about 60 to 80% of silver particles as the conductive material, the paste includes a photosensitive organic component as the photosensitive material, glass frit, and solvent component which amount to about 20 to 40%. The photosensitive paste having this conductive material is formed into a film on the substrate 11 by screen printing.

The plate is chosen from around #150 to #400 (indicative of the degree of roughness) considering the final film thickness desired. Here, the thickness of the layer 12 after drying is set to 7 μm or a bit more and therefore a #400 (indicative of the degree of roughness) plate is used to form the layer.

Thereafter, the photosensitive paste is subjected to drying at around 80 to 150° C. The thickness of the layer 12 after the drying is about 8 μm.

Next, in FIG. 1B, a mask 13 having openings that form a desired wiring pattern is placed to expose the layer 12 in which the photosensitive paste has been dried.

At this point, the exposure light 14 passes through the openings in the mask 13 to expose the photosensitive paste layer 12 as shown in FIG. 1B. Denoted by 15 is a latent image that is an exposed portion of the photosensitive paste.

Next, in FIG. 1C, the photosensitive paste layer 12 that measures about 8 μm in height is subjected to a developing process. The developing process varies depending on the photosensitive paste used but here includes developing with an alkalescent solution, rinsing with pure water to stop developing, and blow drying. Thus obtained is the conductive layer pattern 19 shown in FIG. 1C.

Next, in FIG. 1D, the layer 32 is formed from photosensitive paste that contains a photosensitive material and an insulating material by a method similar to the first film forming. The insulating material of the photosensitive paste used is mainly glass. In addition to about 40 to 80% of glass-based material and metal oxide as the insulating material, the paste contains a photosensitive organic component as the photosensitive material, binder and solvent component, and additive which amount to about 20 to 60%. The photosensitive paste having this insulating material is formed into a film by screen printing.

The plate is chosen from around #150 to #400 (indicative of the degree of roughness) considering the final film thickness desired. Here, the thickness of the layer 32 after drying is set to 12 μm or a bit more and therefore a #200 (indicative of the degree of roughness) plate is used to form the layer.

Thereafter, the photosensitive paste is subjected to drying at around 80 to 150° C. The thickness of the layer 32 after the drying is about 13 μm.

Next, in FIG. 1E, a mask 33 having openings that form a desired insulating pattern is placed to expose the layer 32 in which the photosensitive paste has been dried. The mask 33 is shaped so as to cover a desired part of the conductive layer pattern 19 that is the lower layer.

At this point, the exposure light 17 passes through the openings in the mask 33 to expose the photosensitive paste layer 32 as shown in FIG. 1E. Denoted by 35 is a latent image that is an exposed portion of the photosensitive paste.

Next, in FIG. 1F, the photosensitive paste layer 32 that measures about 13 μm in height is subjected to a developing process. The developing process varies depending on the photosensitive paste used but here includes developing with an alkalescent solution, rinsing with pure water to stop developing, and blow drying. Thus obtained is the insulating layer pattern 39 shown in FIG. 1F.

The conductive layer pattern 19 and insulating layer pattern 39 formed in the above steps are baked as shown in FIG. 1G, thereby forming the wiring pattern 20 and insulating pattern 40 desired. The objective wiring, namely, 20 and 40 are thus completed. The baking step is conducted at a temperature around 500° C. The thickness of the wiring pattern 20 after the baking is about 5 μm, and the insulating pattern 40 after the baking is about 9 μm in thickness.

In this case, portions of the wiring pattern 20 on which the insulating layer is formed as shown in FIG. 1G are about 5 μm in thickness in section both at the center and the edge. The edge curl amount calculated is approximately once and therefore the wiring pattern 20 has no edge curl.

As has been described, the lower layer, which is formed of conductive paste, undergoes the process up through the developing step, then the upper layer, which is formed of insulating paste, undergoes the process up through the developing step, and then the baking step and subsequent steps are carried out for the lower layer and the upper layer both at once. This makes it possible to eliminate the edge curl of the wiring pattern 20 almost completely. Accordingly, spaces to the left and right of the wiring (substrate side spaces low in the width direction of the wiring) can be eliminated.

Since the edge curl of the wiring pattern 20 is eliminated almost completely, no bubbles are generated in the insulating layer when the manufacture method of this embodiment is applied to matrix wiring.

In addition, when upper layer wiring is formed on the insulating layer, the insulating layer exhibits an excellent level of insulation and defects leading to short circuit are greatly reduced.

Since the lower layer has little edge curl, the insulating layer, which is layered thereon in the subsequent step, can have an enough level of insulation without increasing its thickness.

Furthermore, with the edge curl eliminated, the thickness of the insulating layer can be reduced and no disconnection is caused by a level difference in the upper layer wiring formed on the insulating layer.

When the wiring manufactured in this embodiment is used as lead-out wiring of an image-forming apparatus in an airtight seal portion for shutting the interior of the apparatus to the external of the apparatus, the wiring makes it possible to keep airtightness because no spaces are formed to the left and right of the wiring.

Embodiment 2

Figure 2A:
FIGS. 2A, 2B, 2C, 2D, 2E, 2F, 2G, 2H, 2I, 2J and 2K are process diagrams showing a method of manufacturing wiring in accordance with Embodiment 2 of the present invention.
Figure 2B:
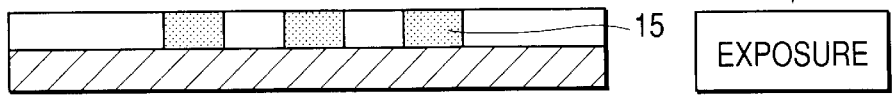
Figure 2C:
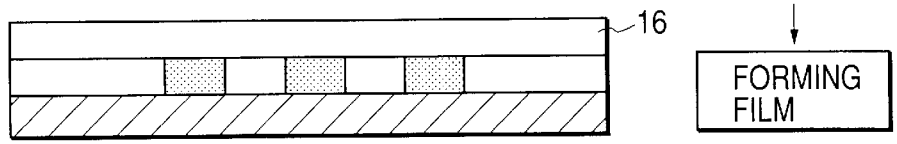
Figure 2D:
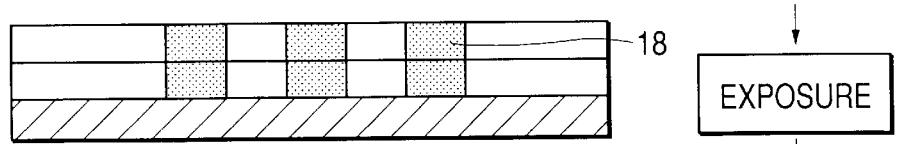
Figure 2E:
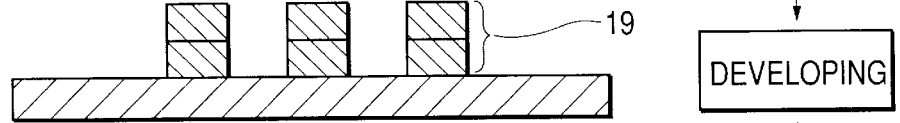
Figure 2F:
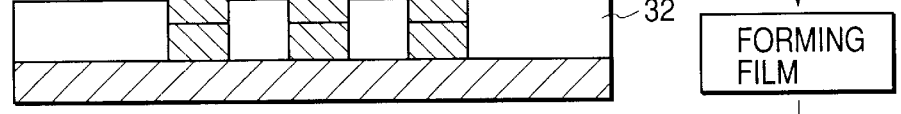
Figure 2G:
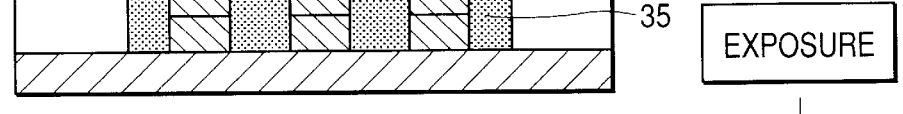
Figure 2H:
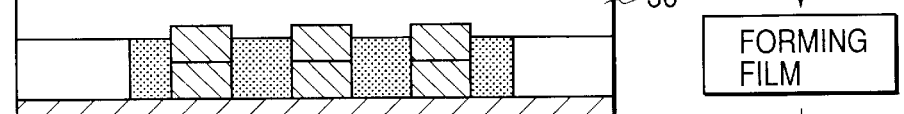
Figure 2I:
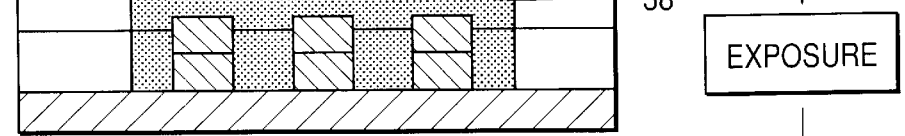
Figure 2J:
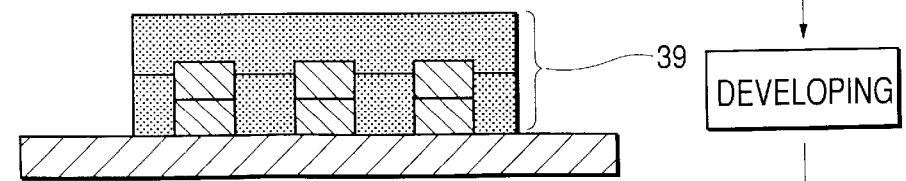
Figure 2K:
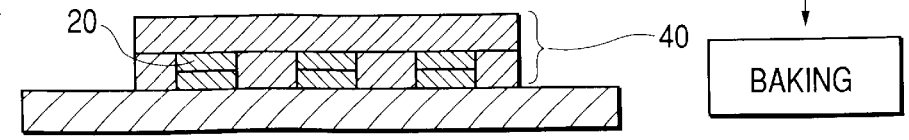

FIGS. 2A to 2K are schematic diagrams showing a process of manufacturing wiring in accordance with this embodiment. FIG. 2A is a diagram showing a state of conductive photosensitive paste after formed into a film and FIG. 2B is a diagram showing a state of the film after exposure. FIG. 2C is a diagram showing a state of conductive photosensitive paste after formed into a film, FIG. 2D is a diagram showing a state of the film after exposure, and FIG. 2E is a diagram showing a state of the films after developing. FIG. 2F is a diagram showing a state of insulating photosensitive paste after formed into a film and FIG. 2G is a diagram showing a state of the film after exposure. FIG. 2H is a diagram showing a state of insulating photosensitive paste after formed into a film, FIG. 2I is a diagram showing a state of the film after exposure, and FIG. 2J is a diagram showing a state of the films after developing. FIG. 2K is a diagram showing a state of the films after baking.

In FIGS. 2A to 2K, 11 denotes a substrate, 12, 16, 32 and 36 denote layers of films formed by applying photosensitive paste, 15, 18, 35 and 38, latent images formed by exposure. 19 is a conductive layer pattern as a developed image, 39 is an insulating layer pattern as a developed image, 20 is a wiring pattern completed, and 40 is an insulating pattern completed.

A method of manufacturing wiring in this embodiment will be described below.

In FIG. 2A, the substrate 11 is formed of soda lime glass. On the substrate 11, the layer 12 is formed from photosensitive paste that contains a photosensitive material and a conductive material.

The conductive material of the photosensitive paste used is mainly silver. In addition to about 60 to 80% of silver particles as the conductive material, the paste includes a photosensitive organic component as the photosensitive material, glass frit, and solvent component which amount to about 20 to 40%. The photosensitive paste having this conductive material is formed into a film on the substrate 11 by screen printing.

The plate is chosen from around #150 to #400 (indicative of the degree of roughness) considering the final film thickness desired. Here, the thickness of the layer 12 after drying is set to 7 µm or a bit more and therefore a #400 (indicative of the degree of roughness) plate is used to form the layer.

Thereafter, the photosensitive paste is subjected to drying at about 80 to 150° C. The thickness of the layer 12 after the drying is about 8 µm.

Next, in FIG. 2B, a mask having openings that form a desired wiring pattern (not shown) is placed to expose the layer 12 in which the photosensitive paste has been dried. At this point, the exposure light passes through the openings in the mask to expose the photosensitive paste layer 12. Denoted by 15 is a latent image that is an exposed portion of the photosensitive paste.

Next, in FIG. 2C, another photosensitive paste is formed into a film on the photosensitive paste layer 12 that measures about 8 µm in height. This photosensitive paste contains the same photosensitive material and conductive material as the layer 12, and is formed into a film by screen printing. Thus obtained is a layer 16. The plate is chosen from around #150 to #400 (indicative of the degree of roughness) considering the final film thickness desired. Here, similar to the layer 12, the thickness of the layer 16 after drying is set to about 7 µm and therefore a #400 (indicative of the degree of roughness) plate is used to form the layer.

Thereafter, the photosensitive paste is subjected to drying at about 80 to 150° C. The thickness of the layer 16 after the drying is about 7 µm and the total thickness measured from the substrate surface is about 15 µm.

Next, in FIG. 2D, a not-shown mask similar to the one in FIG. 2B is placed to expose the layer 16 in which the photosensitive paste has been dried. At this point, the exposure light passes through the openings in the mask to expose the photosensitive paste layer 16. Denoted by 18 is a latent image that is an exposed portion of the photosensitive paste.

Next, in FIG. 2E, the photosensitive paste layers 12 and 16 that measure about 15 µm in height is subjected to a developing process. The developing process varies depending on the photosensitive paste used but here includes developing with an alkalescent solution, rinsing with pure water to stop developing, and blow drying. Thus obtained is the insulating layer pattern 19 shown in FIG. 2E.

Next, in FIG. 2F, the layer 32 is formed from photosensitive paste that contains a photosensitive material and an insulating material by a method similar to the first film forming. The insulating material of the photosensitive paste used is mainly glass. In addition to about 40 to 80% of glass-based material and metal oxide as the insulating material, the paste contains a photosensitive organic component as the photosensitive material, binder and solvent component, and additive which amount to about 20 to 60%. The photosensitive paste having this insulating material is formed into a film by screen printing.

The plate is chosen from around #150 to #400 (indicative of the degree of roughness) considering the final film thickness desired. Here, the thickness of the layer 32 after drying is set to 12 µm or a bit more and therefore a #200 (indicative of the degree of roughness) plate is used to form the layer.

Thereafter, the photosensitive paste is subjected to drying at around 80 to 150° C. The thickness of the layer 32 after the drying is about 13 µm.

Next, in FIG. 2G, a not-shown mask having openings that form a desired insulating pattern is placed to expose the layer 32 in which the photosensitive paste has been dried. The mask is shaped so as to cover a desired part of the developing pattern on the lower layer.

At this point, the exposure light passes through the openings in the mask to expose the photosensitive paste layer 32. Denoted by 35 is a latent image that is an exposed portion of the photosensitive paste.

Next, in FIG. 2H, another photosensitive paste is formed into a film on the photosensitive paste layer 32 that measures about 13 µm in height. This photosensitive paste contains the same photosensitive material and insulating material as the layer 32, and is formed into a film by screen printing. Thus obtained is a layer 36. The plate is chosen from around #150 to #400 (indicative of the degree of roughness) considering the final film thickness desired. Here, similar to the layer 32, the thickness of the layer 36 after drying is set to about 12 µm and therefore a #200 (indicative of the degree of roughness) plate is used to form the layer.

Thereafter, the photosensitive paste is subjected to drying at around 80 to 150° C. The thickness of the layer 36 after the drying is about 12 µm, and the total thickness measured from the substrate surface is about 25 µm.

Next, in FIG. 2I, a not-shown mask similar to the one in FIG. 2G is placed to expose the layer 36 in which the photosensitive paste has been dried. At this point, the exposure light passes through the openings in the mask to expose the photosensitive paste layer 36. Denoted by 38 is a latent image that is an exposed portion of the photosensitive paste.

Next, in FIG. 2J, the photosensitive paste layers 32 and 36 that measure about 25 µm in height is subjected to a developing process. The developing process varies depending on the photosensitive paste used but here includes developing with an alkalescent solution, rinsing with pure water to stop developing, and blow drying. Thus obtained is the insulating layer pattern 39 shown in FIG. 2J.

The conductive layer pattern 19 and insulating layer pattern 39 formed in the above steps are baked at once as shown in FIG. 2K, thereby forming the wiring pattern 20 and insulating pattern 40 desired. The objective wiring, namely, 20 and 40 are thus completed. The baking step is conducted at a temperature around 500° C. The thickness of the wiring pattern 20 after the baking is about 8 µm, and the insulating pattern 40 after the baking is about 16 µm in thickness.

In this case, portions of the wiring pattern 20 on which the insulating layer is formed as shown in FIG. 2K are about 8 µm in thickness in section both at the center and the edge. The edge curl amount calculated is approximately once and therefore the wiring pattern 20 has no edge curl.

As has been described, the lower layer, which is formed of conductive paste, undergoes the process up through the developing step, then the upper layer, which is formed of insulating paste, after several times of the film formation and the exposure, undergoes the process up through the developing step, and then the baking step and subsequent steps are carried out for the lower layer and the upper layer both at once. This makes it possible to eliminate the edge curl of the wiring pattern 20 almost completely. Accordingly, spaces to the left and right of the wiring (substrate side spaces low in the width direction of the wiring) can be eliminated.

Since the edge curl of the wiring pattern 20 is eliminated almost completely, no bubbles are generated in the insulating layer when the manufacture method of this embodiment is applied to matrix wiring.

In addition, when upper layer wiring is formed on the insulating layer, the insulating layer exhibits an excellent level of insulation and defects leading to short circuit are greatly reduced.

Since the lower layer has little edge curl, the insulating layer, which is layered thereon in the subsequent step, can have an enough level of insulation without increasing its thickness.

Furthermore, with the edge curl eliminated, the thickness of the insulating layer can be reduced and no disconnection is caused by a level difference in the upper layer wiring formed on the insulating layer.

When the wiring manufactured in this embodiment is used as lead-out wiring of the image-forming apparatus in an airtight seal portion for shutting the interior of the apparatus to the external of the apparatus, the wiring makes it possible to keep airtightness because no spaces are formed to the left and right of the wiring.

In addition, since plural layers of conductive paste are laid on top of another, it is possible to increase the thickness of the conductive layer and reduce the wiring resistance.

Embodiment 3

FIGS. 3A to 3K are schematic diagrams showing a process of manufacturing wiring in accordance with this embodiment. FIG. 3A is a diagram showing a state of conductive photosensitive paste after formed into a film and FIG. 3B is a diagram showing a state of the film after exposure. FIG. 3C is a diagram showing a state of conductive photosensitive paste after formed into a film, FIG. 3D is a diagram showing a state of the film after exposure, and FIG. 3E is a diagram showing a state of the films after developing. FIG. 3F is a diagram showing a state of insulating photosensitive paste after formed into a film and FIG. 3G is a diagram showing a state of the film after exposure. FIG. 3H is a diagram showing a state of insulating photosensitive paste after formed into a film, FIG. 3I is a diagram showing a state of the film after exposure, and FIG. 3J is a diagram showing a state of the films after developing. FIG. 3K is a diagram showing a state of the films after baking.

In FIGS. 3A to 3K, 11 denotes a substrate, 12, 16, 32 and 36 denote layers of films formed by applying photosensitive paste, 15, 18, 35 and 38, latent images formed by exposure. 19 is a conductive layer pattern as a developed image, 39 is an insulating layer pattern as a developed image, 20 is a wiring pattern completed, and 40 is an insulating pattern completed.

In this embodiment, a not-shown mask used in FIG. 3B and a not-shown mask used in FIG. 3D are different from each other. A not-shown mask used in FIG. 3G and a not-shown mask used in FIG. 3I are different from each other. Specifically, the opening width differs. The opening width of the mask used in FIG. 3D is narrower than that of the mask used in FIG. 3B. The opening width of the mask used in FIG. 3I is narrower than that of the mask used in FIG. 3G. Other than the opening width, the wiring of this embodiment is manufactured in a way similar to the method of Embodiment 2. As a result, the conductive layer pattern 19 formed of conductive photosensitive paste has different line widths for its upper part and lower part as shown in FIG. 3E, and the insulating layer pattern 39 formed of insulating photosensitive paste has different pattern widths for its upper part and lower part as shown in FIG. 3J.

The conductive layer pattern 19 and the insulating layer pattern 39 are baked at once as shown in FIG. 3K, thereby forming the desired wiring pattern 20 and the desired insulating pattern 40. The objective wiring, namely, 20 and 40 are thus completed. The baking step is conducted at a temperature around 500° C. The thickness of the wiring pattern 20 after the baking is about 8 $\mu$m, and the insulating pattern 40 after the baking is about 16 $\mu$m in thickness.

In this case, portions of the wiring pattern 20 on which the insulating layer is formed as shown in FIG. 3K are 8 $\mu$m in thickness in section both at the center and the edge. The edge curl amount calculated is approximately 1 and therefore the wiring pattern 20 has no edge curl.

As has been described, the lower layer, which is formed of conductive paste, after several times of film formation and exposure step, undergoes the process up through the developing step, then the upper layer, which is formed of insulating paste, after several times of film formation and exposure step, undergoes the process up through the developing step, and then the baking step and subsequent steps are carried out for the lower layer and the upper layer both at once. This makes it possible to eliminate the edge curl of the wiring pattern 20 almost completely. Accordingly, spaces to the left and right of the wiring (substrate side spaces low in the width direction of the wiring) can be eliminated.

Since the edge curl of the wiring pattern 20 is eliminated almost completely, no bubbles are generated in the insulating layer when the manufacture method of this embodiment is applied to matrix wiring.

In addition, when upper layer wiring is formed on the insulating layer, the insulating layer exhibits an excellent level of insulation and defects leading to short circuit are greatly reduced.

Since the lower layer has little edge curl, the insulating layer, which is layered thereon in the subsequent step, can have an enough level of insulation without increasing its thickness.

In addition, since plural layers of conductive paste are laid on top of another, it is possible to increase the thickness of the conductive layer and reduce the wiring resistance.

Furthermore, with the edge curl eliminated, the thickness of the insulating layer can be reduced and no disconnection is caused by a level difference in the upper layer wiring formed on the insulating layer. Disconnection by level difference in the upper layer wiring is further avoided because each laminate pattern becomes narrower toward the upper layer.

When the wiring manufactured in this embodiment is used as lead-out wiring of image-forming apparatus in an airtight seal portion for shutting the interior of the apparatus to the exterior of the apparatus, the wiring makes it possible to keep airtightness because no spaces are formed to the left and right of the wiring. Moreover, since each laminate pattern becomes narrower toward the upper layer, a seal agent used for airtight sealing can readily be applied to the seal portion and the reliability in sealing is enhanced even more.

Embodiment 4

This embodiment shows an example in which PD200 glass is used for a substrate 11 instead of the soda lime glass substrate used in Embodiment 3. Compared to soda lime glass, PD200 glass is reduced mainly in Na component and is often used in plasma displays that are image-forming apparatus. A PD200 glass substrate and a soda lime glass substrate have almost the same thermal expansion coefficient, etc. Accordingly, wiring in this embodiment is manufactured from the same paste as used in Embodiment 3 by a method similar to the method of Embodiment 3. The wiring substrate completed is used as a substrate for a flat panel image-forming apparatus.

When wiring is manufactured on the PD200 glass of this embodiment, the edge curl of the wiring pattern 20 can be eliminated almost completely as in Embodiment 3. Accordingly, spaces to the left and right of the wiring (substrate side spaces low in the width direction of the wiring) can be eliminated.

Since the edge curl of the wiring pattern 20 is eliminated almost completely, no bubbles are generated in the insulating layer when the manufacture method of this embodiment is applied to matrix wiring.

In addition, when upper layer wiring is formed on the insulating layer, the insulating layer exhibits an excellent level of insulation and defects leading to short circuit are greatly reduced.

Since the lower layer has little edge curl, the insulating layer, which is layered thereon in the subsequent step, can have an enough level of insulation without increasing its thickness.

In addition, since plural layers of conductive paste are laid on top of another, it is possible to increase the thickness of the conductive layer and reduce the wiring resistance.

Also, with the edge curl eliminated, the thickness of the insulating layer can be reduced and no disconnection is caused by a level difference in the upper layer wiring formed on the insulating layer. Disconnection by level difference in the upper layer wiring is further avoided because each laminate pattern becomes narrower toward the upper layer.

Also, when the wiring manufactured in this embodiment is used as lead-out wiring of image-forming apparatus in an airtight seal portion for shutting the interior of the apparatus to the exterior of the apparatus, the wiring makes it possible to keep airtightness because no spaces are formed to the left and right of the wiring. Moreover, since each laminate pattern becomes narrower toward the upper layer, a seal agent used for airtight sealing can readily be applied to the seal portion and the reliability in sealing is enhanced even more.

This embodiment proves that excellent wiring can be manufactured on a PD200 glass substrate by a process similar to the one used for a soda lime glass substrate.

Embodiment 5

This embodiment shows an example in which no-alkali glass is used for a substrate 11 instead of the soda lime glass substrate used in Embodiment 3. Compared to soda lime glass and PD200 glass, no-alkali glass contains very little alkali and therefore is about half in thermal expansion coefficient (around 30 to $50 \times 10^{-7}$/K). For that reason, the thermal expansion coefficient of glass paste used in this embodiment is made as close to the thermal expansion coefficient of the substrate as possible, and wiring is manufactured by a method similar to the method of Embodiment 3. The wiring substrate completed is used as a substrate for the flat panel image-forming apparatus.

When wiring is manufactured on the no-alkali glass of this embodiment, the edge curl of the wiring pattern 20 can be eliminated almost completely as in Embodiment 3. Accordingly, spaces to the left and right of the wiring (substrate side spaces low in the width direction of the wiring) can be eliminated.

Since the edge curl of the wiring pattern 20 is eliminated almost completely, no bubbles are generated in the insulating layer when the manufacture method of this embodiment is applied to matrix wiring.

In addition, when upper layer wiring is formed on the insulating layer, the insulating layer exhibits an excellent level of insulation and defects leading to short circuit are greatly reduced.

Since the lower layer has little edge curl, the insulating layer, which is layered thereon in the subsequent step, can have an enough level of insulation without increasing its thickness.

In addition, since plural layers of conductive paste are laid on top of another, it is possible to increase the thickness of the conductive layer and reduce the wiring resistance.

Furthermore, with the edge curl eliminated, the thickness of the insulating layer can be reduced and no disconnection is caused by a level difference in the upper layer wiring formed on the insulating layer. Disconnection by level difference in the upper layer wiring is further avoided because each laminate pattern becomes narrower toward the upper layer.

When the wiring manufactured in this embodiment is used as lead-out wiring of image-forming apparatus in an airtight seal portion for shutting the interior of the apparatus to the exterior of the apparatus, the wiring makes it possible to keep airtightness because no spaces are formed to the left and right of the wiring. Moreover, since each laminate pattern becomes narrower toward the upper layer, a seal agent used for airtight sealing can readily be applied to the seal portion and the reliability in sealing is enhanced even more.

This embodiment proves that excellent wiring can be manufactured on a no-alkali glass substrate by a process similar to the one used for a soda lime glass substrate and a PD200 glass substrate.

Embodiment 6

In this embodiment, an electron source and image-forming apparatus are manufactured employing the method of manufacturing wiring of Embodiment 2.

First, a description is given with reference to FIGS. 2A to 2K and FIGS. 4 to 10 on a method of manufacturing an electron source of this embodiment.

(Step 1)

A substrate 11 that is a rear plate is prepared by depositing $SiO_2$ on the surface of soda lime glass by sputtering to a thickness of 0.5 μm.

(Step 2)

Figure 4:
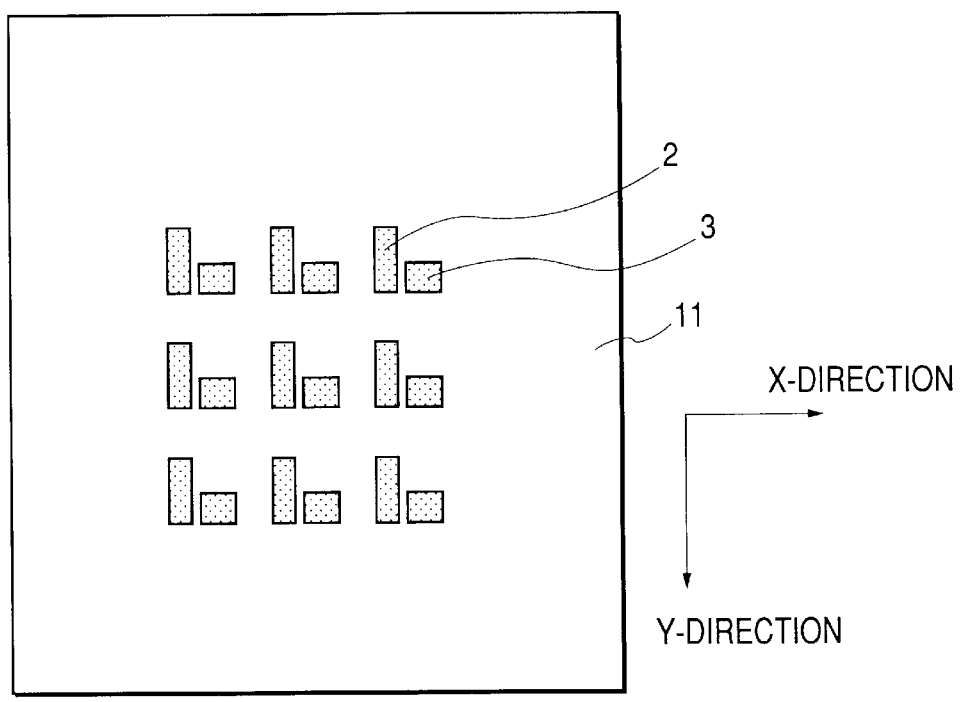
FIG. 4 is a process diagram showing a method of manufacturing an electron source in accordance with Embodiment 6 of the present invention.
Figure 5:
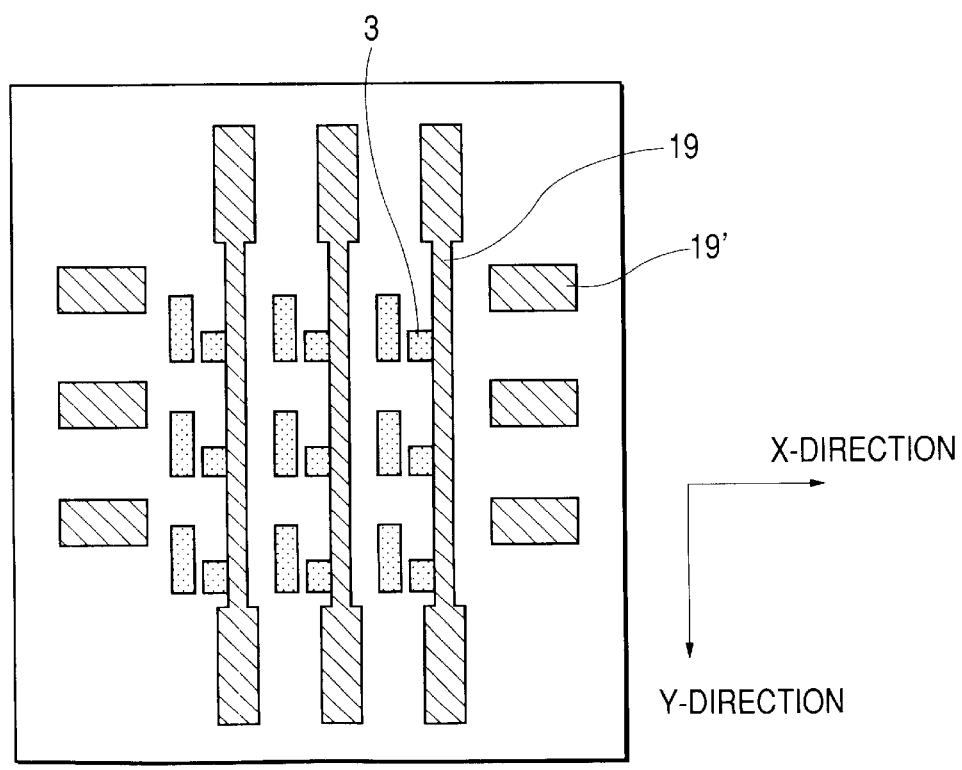
FIG. 5 is a process diagram showing a method of manufacturing an electron source in accordance with Embodiment 6 of the present invention.
Figure 6:
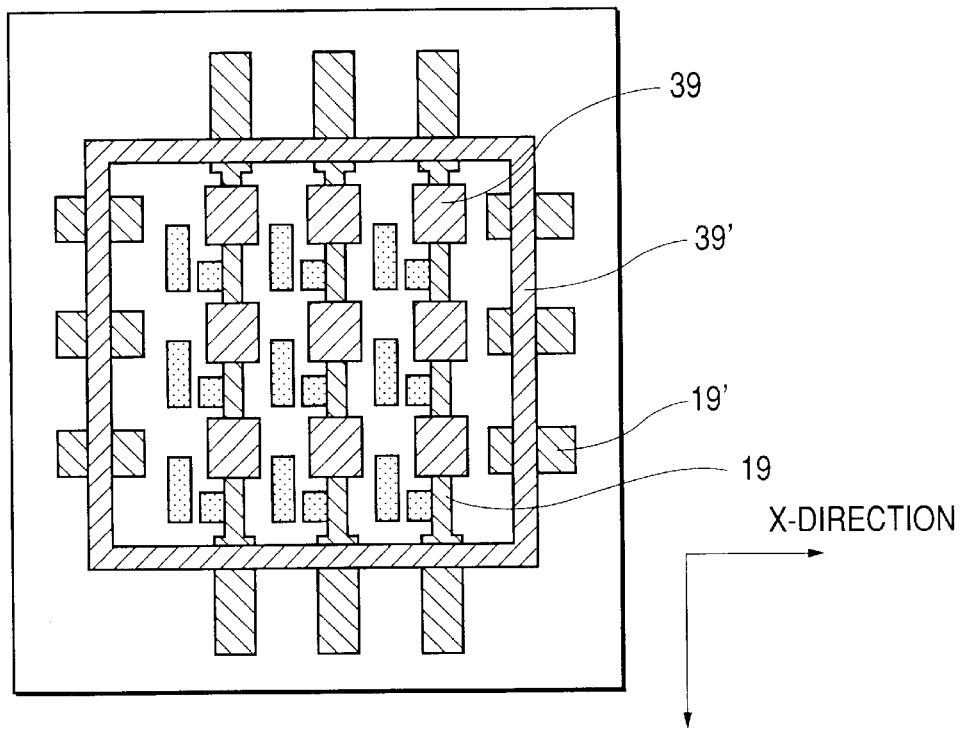
FIG. 6 is a process diagram showing a method of manufacturing an electron source in accordance with Embodiment 6 of the present invention.

On the surface where $SiO_2$ is formed into a film, a pair of electrodes 2 and 3 are formed such that the X-direction has 1000 pairs and the Y-direction has 5000 pairs (FIG. 4). Note that FIG. 4 shows only 3 pairs of electrodes 2 and 3 in the X-direction and 3 pairs in the Y-direction, 9 pairs in total, in order to simplify the explanation.

The material used for the electrodes 2 and 3 is Pt in this embodiment. The electrodes 2 and 3 are formed using photolithography. The distance between the electrodes 2 and 3 is set to 20 μm.

(Step 3)

In a manner similar to Embodiment 2, conductive photosensitive paste is applied to the entire surface of the substrate 11 which serves as the rear plate and on which the electrodes 2 and 3 have been formed. Thus obtained is a layer 12 formed of photosensitive paste (See FIG. 2A).

The photosensitive paste used in this embodiment is the same as the one used in Embodiment 2. The paste contains Ag particles as a conductive material and an acrylic resin that is a photosensitive organic material cured in reaction to ultraviolet rays, with a glass filler or the like added thereto.

(Step 4)

Thereafter, the layer 12 formed of photosensitive paste is dried. The dried layer 12 is irradiated with (exposed to) ultraviolet exposure light using a light-shielding mask (not shown in the drawing) that has stripe pattern openings (See FIG. 2B).

(Step 5)

Next, the photosensitive paste used in the above Step 3 is applied to the top face of the layer 12 that has an exposed region 15 and an unexposed region, thereby obtaining a layer 16 formed of photosensitive paste (See FIG. 2C).

(Step 6)

The layer 16 is then dried. The dried layer 16 is irradiated with (exposed to) ultraviolet exposure light using the light-shielding mask with stripe pattern openings which has been used in the above Step 4 (See FIG. 2D). In Step 6, the layer 16 is exposed such that an exposed region 18 of the layer 16 substantially overlaps the exposed region 15 of Step 4.
(Step 7)

Subsequently, the substrate 11 serving as the rear plate is washed with an alkalescent solution to remove (develop) unexposed portions of the layers 12 and 16 at once. Thus obtained are conductive layer patterns 19 and 19' shown in FIG. 5 (See FIG. 2E).
(Step 8)

In a manner similar to Embodiment 2, insulating photosensitive paste is applied to the entire surface of the substrate 11 which serves as the rear plate and on which the conductive layer patterns 19 and 19' have been formed. A layer 32 formed of insulating photosensitive paste is formed as a result (See FIG. 2F).

The photosensitive paste used in this embodiment is the same as the one used in Embodiment 2. The paste contains glass-based particles and metal oxide particles as an insulating material and an acrylic resin that is a photosensitive organic material cured in reaction to ultraviolet rays, with a solvent, an additive and the like added thereto.
(Step 9)

Thereafter, the layer 32 formed of photosensitive paste is dried. The dried layer 32 is irradiated with (exposed to) ultraviolet exposure light using a light-shielding mask (not shown in the drawing) that has plural desired openings (See FIG. 2G). The exposure pattern in this step is designed such that an insulating layer pattern 39 is formed at each of intersections between row-directional wiring that are to be formed in a later step and column-directional wiring (the conductive layer pattern 19) that have already been formed. The exposure pattern is also designed such that an insulating layer pattern 39' is formed to cross each conductive layer pattern 19'.
(Step 10)

Next, the photosensitive paste used in the above Step 8 is applied to the top face of the layer 32 that has an exposed region 35 and an unexposed region, thereby obtaining a layer 36 formed of photosensitive paste (See FIG. 2H).
(Step 11)

The layer 36 is then dried. The dried layer 36 is irradiated with (exposed to) ultraviolet exposure light using the light-shielding mask with plural desired openings which has been used in the above Step 9 (See FIG. 2I). In Step 11, the layer 36 is exposed such that an exposed region 38 of the layer 36 substantially overlaps the exposed region 35 of Step 9.
(Step 12)

Subsequently, the substrate 11 serving as the rear plate is washed with an alkalescent solution to remove (develop) unexposed portions of the layers 32 and 36 at once. Thus obtained are the insulating layer patterns 39 and 39' shown in FIG. 6 (See FIG. 2J).
(Step 13)

Figure 7:
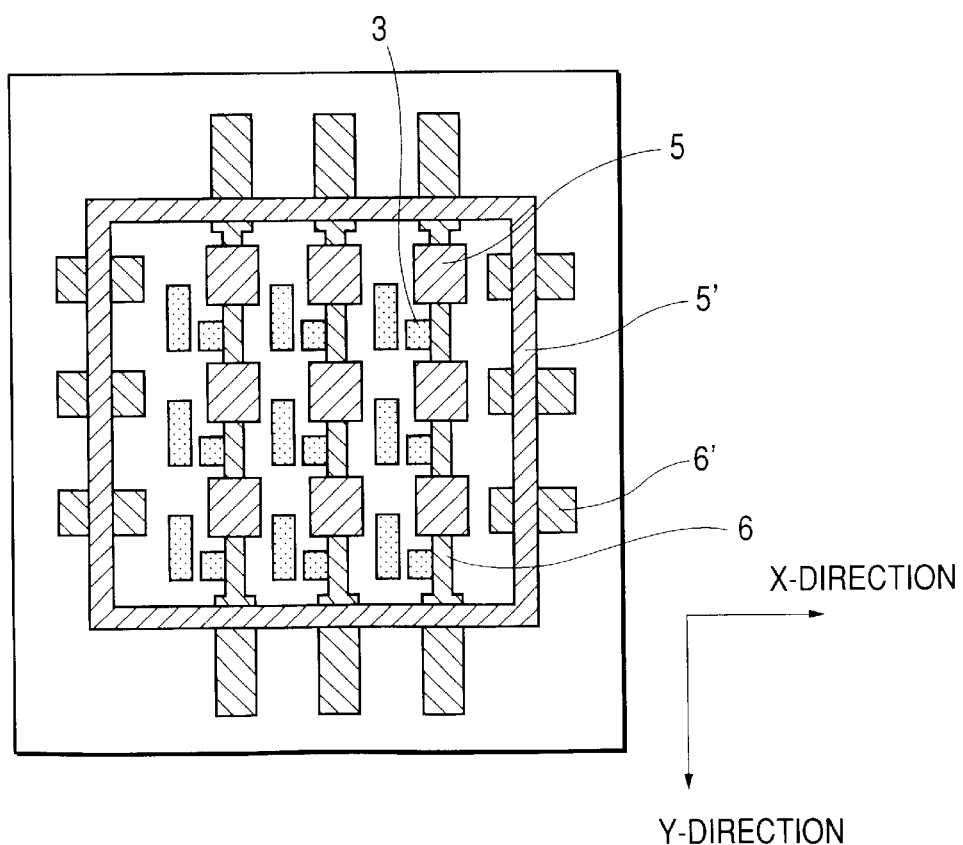
FIG. 7 is a process diagram showing a method of manufacturing an electron source in accordance with Embodiment 6 of the present invention.

The substrate 11 serving as the rear plate is baked to form, as the wiring pattern 20 shown in FIG. 2K, 5000 lines of column-directional wiring 6 each measuring 50 μm in width at a 180 μm pitch (FIG. 7) and to form, as the insulating pattern 40 shown in FIG. 2K, insulating layers 5 at portions where column-directional wiring 6 cross row-directional wiring 4 to be formed in a later step (FIG. 7). In FIG. 7, 6' denotes lead-out wiring portions connected to the row-directional wiring 4 that are to be formed in a later step. Denoted by 5' is an insulating layer formed in a portion corresponding to an airtight seal portion. Through this step, the electrodes 3 are connected to the column-directional wiring 6.

(Step 14)

Figure 8:
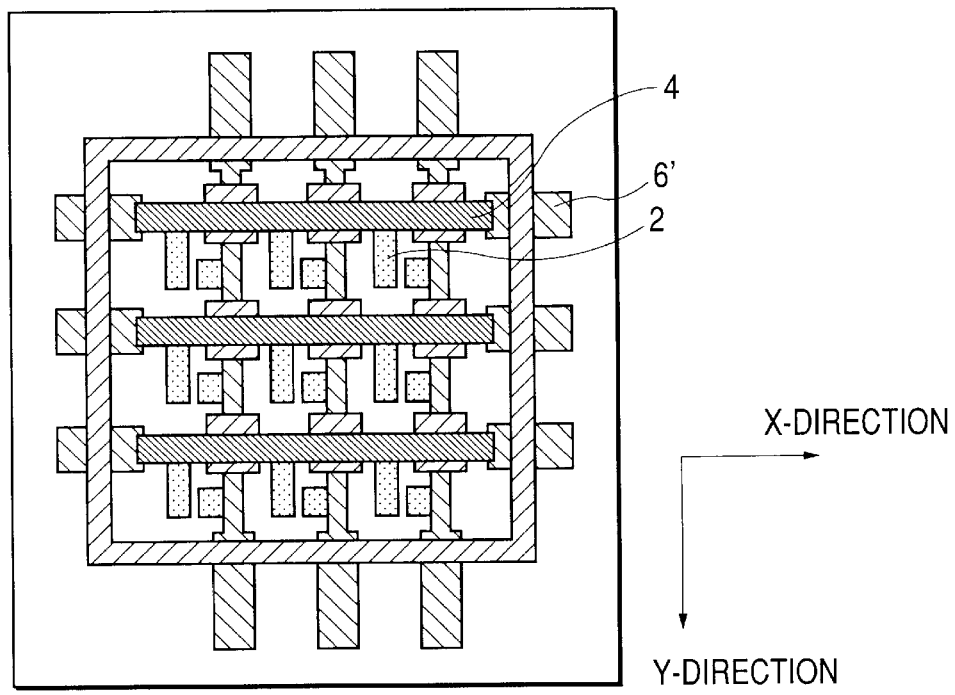
FIG. 8 is a process diagram showing a method of manufacturing an electron source in accordance with Embodiment 6 of the present invention.

The paste containing Ag particles, a glass binder, and a resin is applied by screen printing to form a linear pattern. The paste is then baked to form 1000 lines of row-directional wiring 4 (FIG. 8). Through this step, the electrodes 2 are connected to the row-directional wiring 4 and the lead-out wiring portions 6' are also connected to the row-directional wiring 4. Each row-directional wiring 4 is 150 μm in width and the pitch between lines of the row-directional wiring 4 is set to 500 μm.
(Step 15)

Figure 9:
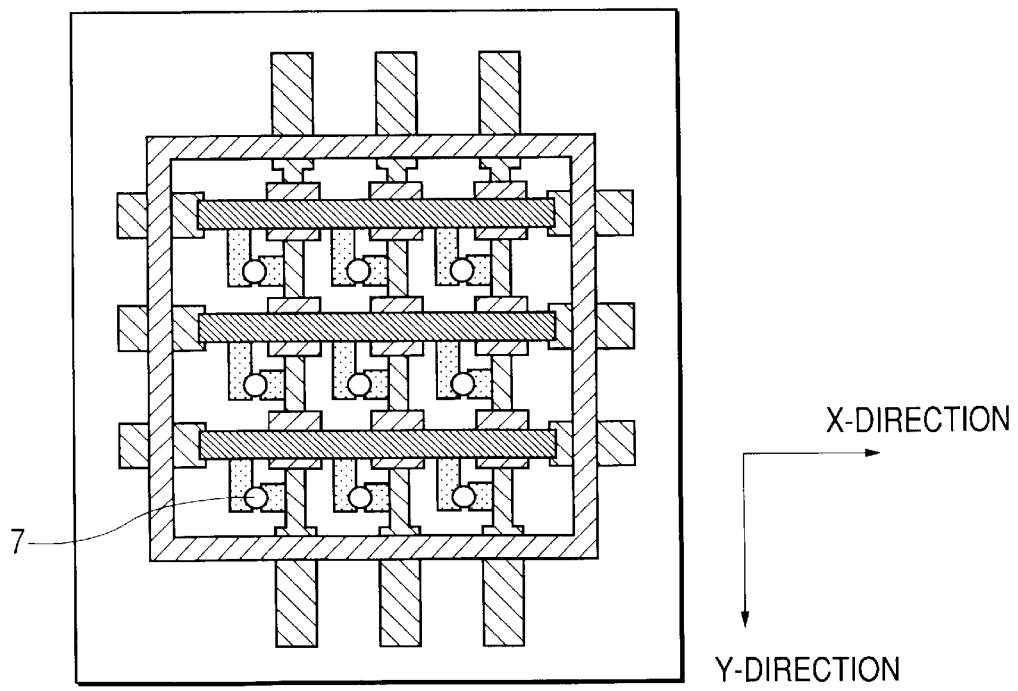
FIG. 9 is a process diagram showing a method of manufacturing an electron source in accordance with Embodiment 6 of the present invention.

Next, an aqueous solution containing Pd is put in all the gap portions between the electrodes 2 and the electrodes 3. Then the substrate is baked in the atmospheric air at 350° C. to form electron-emitting conductive films 7 composed of PdO (FIG. 9).

In this embodiment, ink jet apparatus of piezo type that is one of ink jet methods is used to put the ink described above in the gap portions. The ink containing Pd in this embodiment is an aqueous solution having 0.15% of organic Pd compound, 15% of isopropyl alcohol, 1% of ethylene glycol, and 0.05% of polyvinyl alcohol.

Through the above steps, a pre-forming electron source substrate (rear plate) is obtained.
(Step 16)

The pre-forming electron source substrate obtained through the steps described above is placed in a vacuum chamber. The interior of the chamber is exhausted until it reaches $10^{-4}$ Pa and then hydrogen is introduced into the chamber. In this state, a "forming step" is conducted in which the voltage of each column-directional wiring 6 is set to 0 V whereas a pulse-like voltage is sequentially applied to lines of the row-directional wiring 4. Through this step, a current flows in each of the electron-emitting conductive films 7 and a gap is formed in a part of each of the electron-emitting conductive films 7.

In the forming step, a constant voltage pulse of 5 V is repeatedly applied. The pulse width and pulse interval of the voltage waveform are set to 1 msec and 10 msec, respectively, creating a triangular wave. The energization forming operation is ended when the resistance of the electron-emitting conductive films 7 reaches 1 MΩ or more.
(Step 17)

The device that has undergone the forming step is subjected to treatment called an activation process. Specifically, the "activation process" includes exhausting the interior of the vacuum chamber where the electron source substrate after the forming is placed until it reaches $10^{-6}$ Pa; introducing benzonitrile until it reaches $1.3 \times 10^{-4}$ Pa; setting the voltage of each column-directional wiring 6 to 0 V; and repeating sequential application of pulse-like voltage to lines of the row-directional wiring 4. Through this step, carbon films are formed inside the gaps of the electron-emitting conductive films 7 which have been formed in the forming step and on the films in the vicinity of the gaps. Thus formed are electron-emitting regions 8 (FIG. 10).

In the activation step, a rectangular wave pulse voltage with the pulse wave height set to 15 V, the pulse width set to 1 msec, and the pulse interval set to 10 msec is applied to each device.

Figure 10:
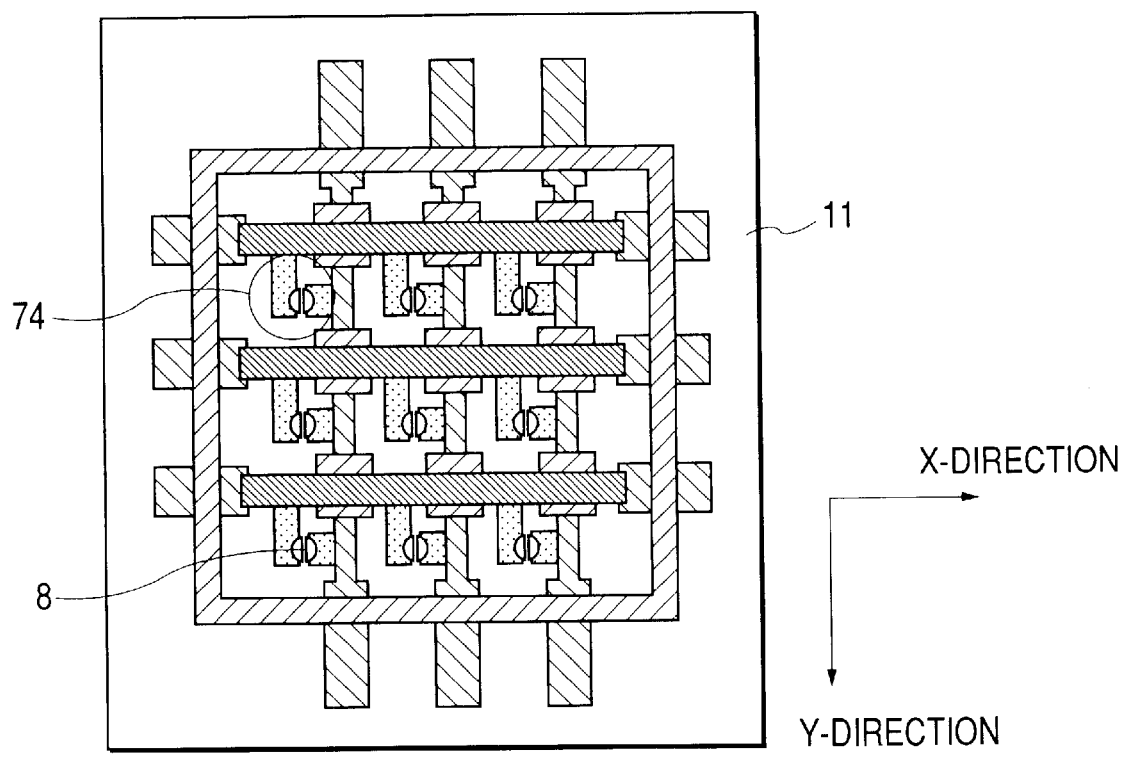
FIG. 10 is a process diagram showing a method of manufacturing an electron source in accordance with Embodiment 6 of the present invention.

Through the above steps, the electron source (rear plate) substrate 11 in which a plurality of electron-emitting devices 74 shown in FIG. 10 are arranged is completed.

According to an evaluation on electric characteristics of this electron source substrate, the column-directional wiring 6 and the row-directional wiring 4 are securely insulated from each other.

Figure 11:
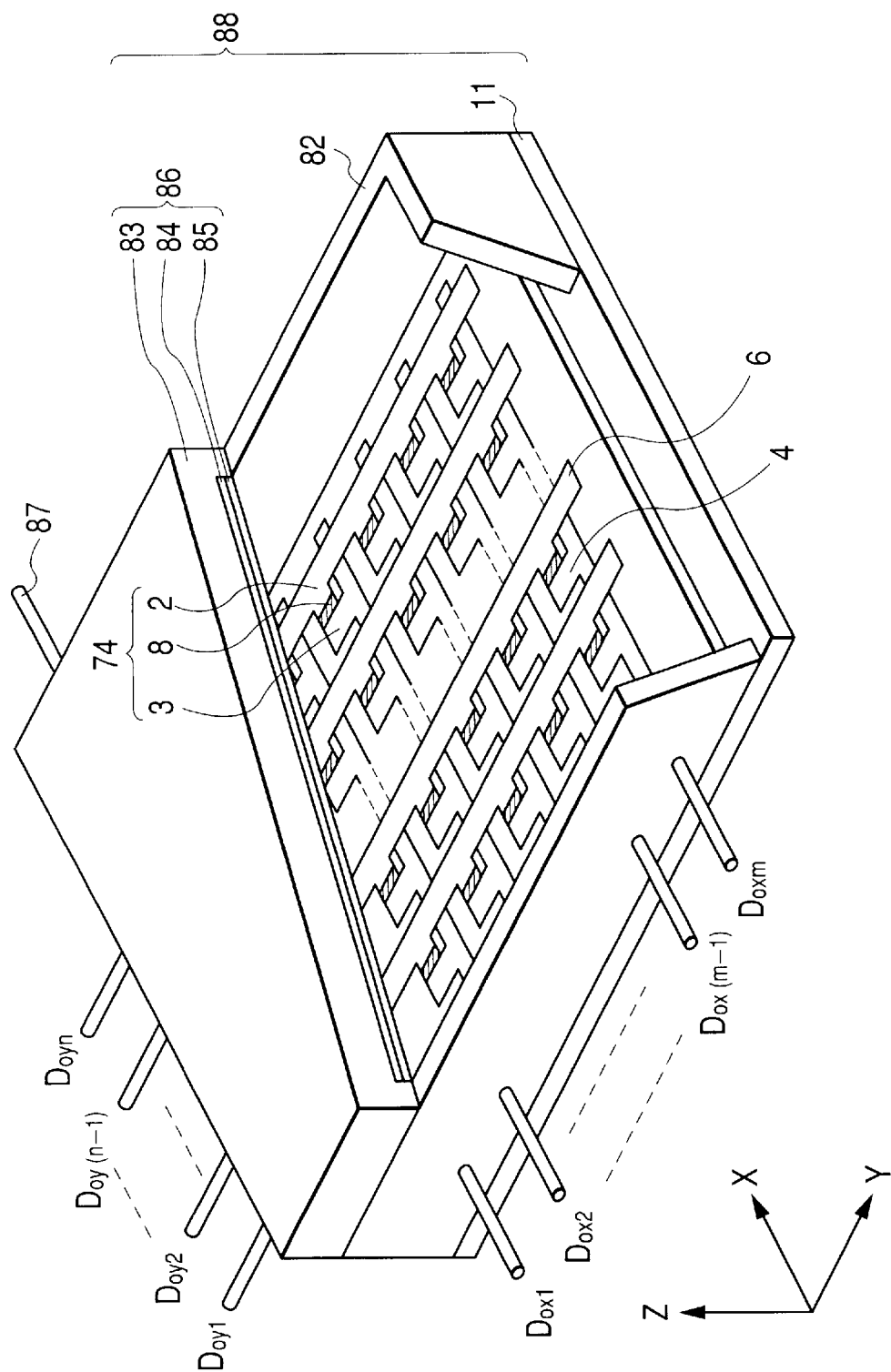
FIG. 11 is a rough structural diagram showing image-forming apparatus according to Embodiment 6 of the present invention.
Figure 12A:
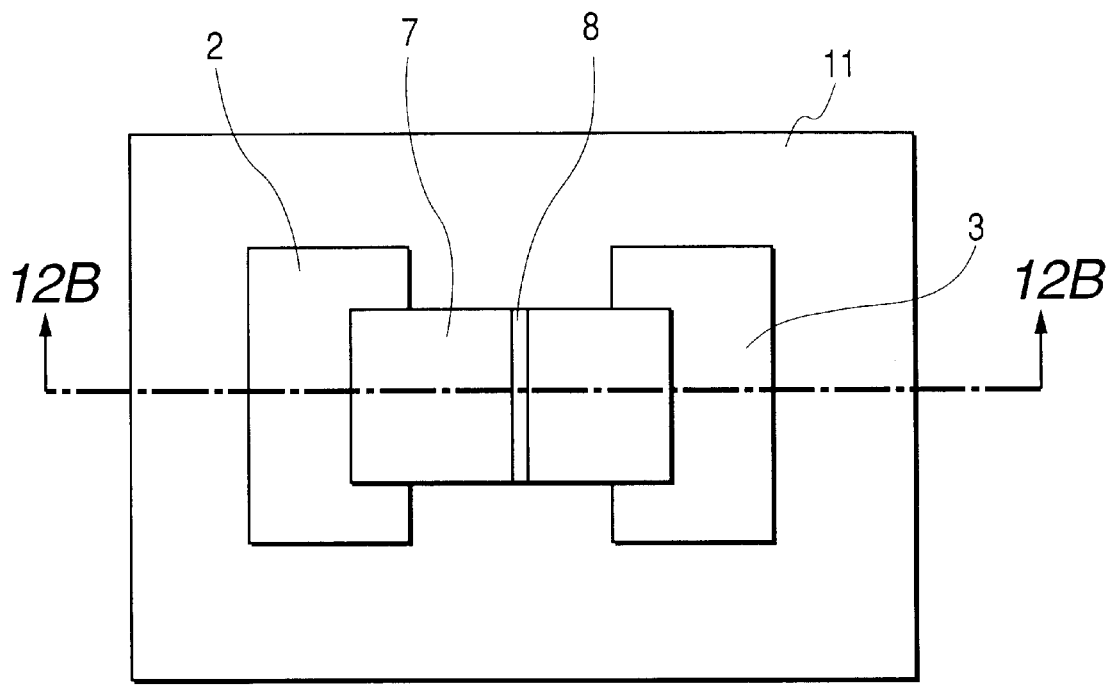
FIGS. 12A and 12B are schematic diagrams showing an example of a surface conduction electron-emitting device.
Figure 12B:
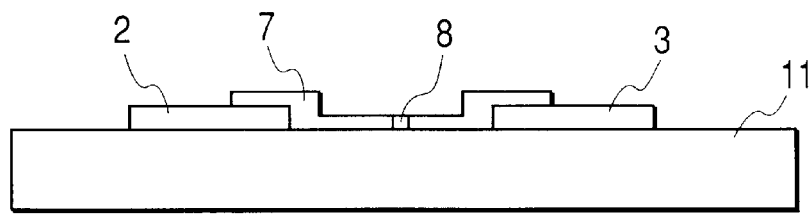

Next, image-forming apparatus shown in FIG. 11 is manufactured using the thus obtained electron source (substrate 11). In FIG. 11, 82 denotes an outer frame and 86 denotes a face plate where an image-forming member 84 is arranged.

A method of manufacturing image-forming apparatus of this embodiment will be described below.

(Step 18)

First, the face plate substrate 83 formed of the same material as the rear plate, i.e., the substrate 11, is washed and dried thoroughly. Thereafter a black member is formed on the substrate 83 using photolithography. Here, the black member is formed into a lattice having openings that coincide with the positions of phosphors of respective colors. The pitch of the black member in the Y-direction is the same as the pitch of the column-directional wiring 6, and the pitch of the black member in the X-direction is the same as the pitch of the row-directional wiring 4.

(Step 19)

Red phosphors, blue phosphors, and green phosphors are formed in the openings of the black member using screen printing.

(Step 20)

A filming layer is formed on the black member and the phosphors. The material of the filming layer is a polymethacrylate-based resin dissolved in an organic solvent. The material is applied by screen printing and dried.

(Step 21)

Next, Al is deposited on the filming layer by evaporation.

(Step 22)

Thereafter the substrate 83 is heated to remove the resin contained in the phosphor paste and the filming layer. Thus obtained are an image-forming member 84 and a face plate 86. 84 is a phosphor layer composed of the phosphors and the black member. 86 is the substrate 83 on which a metal back 85 formed of Al is formed.

(Step 23)

Between the substrate 11 serving as the rear plate and the face plate 86 formed through the above steps, a spacer (not shown in the drawing) having a highly resistant film on its surface and the outer frame 82 with a joint member placed in an airtight seal portion are arranged.

(Step 24)

With the face plate 86 and the substrate 11 that serves as the rear plate carefully aligned, the plates are heated and pressurized in vacuum to soften the joint member and joins the members. Through this seal bonding step, an envelope (display panel) 88 shown in FIG. 11 is obtained as the image-forming apparatus whose interior is kept under high vacuum.

The highly resistant film on the surface of the spacer is provided to discharge electric charges accumulated on the spacer surface when the spacer surface is irradiated with electrons or the like to the row-directional wiring 4 or the metal back 85.

The spacer is abutted with the row-directional wiring (wiring to which scan signals are applied) 4 in order not to block the path of electron beam emitted from the electron-emitting devices 74. Easiness in aligning the spacer with the row-directional wiring 4 is another reason.

A drive circuit is connected through a flexible printed circuit to the lead-out wiring portions led out from the interior of the thus obtained display panel 88, and animation is displayed by linear sequential scanning. In this embodiment, scan signals are applied to the row-directional wiring 4 each having a large area in section and modulation signals are applied to the column-directional wiring 6.

When the display panel 88 displays animation in this way, images of very high definition and luminance can be obtained for a long period of time. The wiring is not damaged when the flexible printed circuit is connected to the lead-out portions of the row-directional wiring 4 and column-directional wiring 6. Also, a pixel defect, caused supposedly by electric discharge phenomenon, does not take place.

The display panel 88 may take a structure in which a substrate 81 that is a rear plate is provided separately from a substrate 11 to fix the substrate 11 as in the prior art shown in FIG. 13.

As described above, according to a method of manufacturing wiring of the present invention, wiring having almost no edge curl in a portion where an insulating layer is formed can be manufactured. Therefore, in a circuit substrate and electron source which use wiring formed by a manufacture method of the present invention, factors that make the insulating layer contain bubbles are eliminated. As a result, the level of insulation is improved, and the circuit substrate and the electron sources can have satisfying performance and be applicable to various uses.

In the image-forming apparatus using wiring that is formed by a manufacture method of the present invention, unlike prior art, the insulating layer does not need an additional thickness corresponding to the height of the edge curl, thereby making it possible to reduce the film thickness of the insulating layer; and no spaces are created to the left and right of the wiring, thereby making it possible to keep airtightness in the airtight seal portion. As a result, the performance of the image-forming apparatus is improved and the image-forming apparatus can be applied to various uses.

Therefore, short circuit defect, defective sealing, and the thickness of layers can be reduced and various defects caused supposedly by insufficient conduction in a stepped portion are eliminated in the flat panel image-forming apparatus having a large screen and electron-emitting devices. Accordingly, a highly reliable image-forming apparatus of high performance can be obtained.

What is claimed is:

1. A method of manufacturing wiring comprising:
    a step of forming a conductive layer pattern through a developing step after performing film formation and exposure step once or several times using photosensitive paste that contains a photosensitive material and a conductive material;
    a step of forming an insulating layer pattern on at least a part of the conductive layer pattern through a developing step after performing film formation and exposure step once or several times using photosensitive paste that contains a photosensitive material and an insulating material; and
    a baking step for baking the conductive layer pattern and the insulating layer pattern thereby reducing an edge curl of the conductive layer pattern.

2. A method of manufacturing wiring according to claim 1, wherein the step of forming the conductive layer pattern includes conducting the film formation and exposure step several times and the same exposure pattern is used in the plural exposure steps.

3. A method of manufacturing wiring according to claim 1, wherein the step of forming the conductive layer pattern includes conducting the film formation and exposure step several times and the different exposure pattern is used in the plural exposure steps.

4. A method of manufacturing wiring according to claim 1, wherein the step of forming the insulating layer pattern includes conducting the film formation and exposure step several times and the same exposure pattern is used in the plural exposure steps.

5. A method of manufacturing wiring according to claim 1, wherein the step of forming the insulating layer pattern includes conducting the film formation and exposure step several times and the different exposure pattern is used in the plural exposure steps.

6. A method of manufacturing wiring according to claim 1, wherein the main ingredient of the conductive material is a metal and the main ingredient of the insulating material is glass.

7. A method of manufacturing wiring according to claim 1, wherein the conductive material is composed of conductive particles.

8. A method of manufacturing wiring according to claim 1, wherein the wiring thickness after the baking step is set to 5 $\mu$m or more.

9. A method of manufacturing a circuit substrate with wiring, wherein the wiring is manufactured by a manufacture method of claim 1.

10. A method of manufacturing an electron source with wiring and an electron-emitting device that is supplied with current by the wiring to be driven, wherein the wiring is manufactured by a manufacture method of claim 1.

11. A method of manufacturing image-forming apparatus with an electron source and an image-forming member that forms an image by electrons emitted from the electron source, wherein the electron source is manufactured by the manufacture method of claim 10.

12. A method of manufacturing a member pattern with a first member patterned on a substrate and a second member patterned and extending over the first member onto the substrate, the method comprising:
- a step of applying first photosensitive paste onto the substrate;
- a step of forming a precursor pattern of the first member by exposing and developing the first photosensitive paste;
- a step of applying second photosensitive paste over the top face of the precursor pattern of the first member onto the substrate;
- a step of forming a precursor pattern of the second member by exposing and developing the second photosensitive paste; and
- a step of baking the precursor patterns of the first and second members thereby reducing an edge curl of the first member.

* * * * *